United States Patent
Chan et al.

(10) Patent No.: US 9,923,339 B2
(45) Date of Patent: Mar. 20, 2018

(54) TUNABLE AMPLIFIED SPONTANEOUS EMISSION (ASE) LASER

(71) Applicant: Hong Kong Baptist University, Hong Kong (HK)

(72) Inventors: Kin Long Chan, Hong Kong (HK); Gui Xin Li, Hong Kong (HK); Ka Suen Lee, Hong Kong (HK); Kok Wai Cheah, Hong Kong (HK)

(73) Assignee: HONG KONG BAPTIST UNIVERSITY, Kowloon Tong, Kowloon (HK)

( * ) Notice: Subject to any disclaimer, the term of this patent is extended or adjusted under 35 U.S.C. 154(b) by 0 days.

(21) Appl. No.: 15/437,427

(22) Filed: Feb. 20, 2017

(65) Prior Publication Data

US 2017/0163011 A1   Jun. 8, 2017

Related U.S. Application Data

(63) Continuation-in-part of application No. 14/684,450, filed on Apr. 13, 2015, now Pat. No. 9,614,346.

(60) Provisional application No. 61/978,985, filed on Apr. 13, 2014.

(51) Int. Cl.
| | |
|---|---|
| *H01S 3/091* | (2006.01) |
| *H01S 5/36* | (2006.01) |
| *H01S 5/04* | (2006.01) |
| *G01H 9/00* | (2006.01) |
| *H01S 3/16* | (2006.01) |
| *H01S 3/23* | (2006.01) |
| *G01B 11/00* | (2006.01) |
| *H01S 3/094* | (2006.01) |

(52) U.S. Cl.
CPC ............... *H01S 5/36* (2013.01); *G01H 9/004* (2013.01); *H01S 3/168* (2013.01); *H01S 3/2391* (2013.01); *H01S 5/041* (2013.01); *G01B 11/002* (2013.01); *H01S 3/094* (2013.01); *H01S 2301/02* (2013.01)

(58) Field of Classification Search
CPC .......... H01S 5/36; H01S 3/2391; H01S 3/168; H01S 5/041; H01S 3/094; H01S 2301/02; G01H 9/004; G01H 11/002
See application file for complete search history.

(56) References Cited

U.S. PATENT DOCUMENTS

| | | | | |
|---|---|---|---|---|
| 4,638,484 A | * | 1/1987 | Rand | C30B 31/22 372/42 |
| 9,614,346 B2 | * | 4/2017 | Chan | H01S 3/168 |
| 2007/0242719 A1 | * | 10/2007 | Spoonhower | G02B 21/32 372/50.124 |
| 2008/0253419 A1 | * | 10/2008 | Feklistov | H01S 3/005 372/38.03 |
| 2014/0252332 A1 | * | 9/2014 | Carroll | B82Y 10/00 257/40 |

* cited by examiner

*Primary Examiner* — Yuanda Zhang
(74) *Attorney, Agent, or Firm* — Idea Intellectual Limited; Margaret A. Burke; Sam T. Yip

(57) ABSTRACT

This invention relates to a tunable amplified spontaneous emission (ASE) laser source comprising at least two laser sources excited by a single pump laser. More particularly, the present invention relates to a tunable amplified spontaneous emission (ASE) laser source comprising at least two laser sources excited by a single pump laser wherein said at least two laser sources each comprise an organic laser or a cascaded organic laser. The invention is used for providing a tunable amplified spontaneous emission (ASE) laser source comprising at least two laser sources excited by a single pump laser.

12 Claims, 20 Drawing Sheets

(a) Cascaded Organic Laser for 2-axis measurement (x and z-direction, OR y and z-direction)

(b) Cascaded Organic Laser for 3-axis and angular measurements b)

(b) Cascaded Organic Laser for 3-axis and angular measurements (a) Cascaded Organic Laser for 2-axis measurement (x and z-direction, OR y and z-direction)

a) Multiwavelength Pulsed Laser Source

Multiwavelength Pulsed Laser b) 2-D Configuration of Multiwavelength Pulsed Laser Source Multiwavelength Pulsed Laser with Pico to Femto-second Delays

TUNABLE AMPLIFIED SPONTANEOUS EMISSION (ASE) LASER

CROSS-REFERENCE TO THE RELATED APPLICATIONS

This application is a continuation-in-part of U.S. Non-Provisional patent application Ser. No. 14/684,450 filed on Apr. 13, 2015, which claims the benefit of U.S. Provisional Patent Application Ser. No. 61/978,985 filed on Apr. 13, 2014, is the disclosures of which are hereby incorporated by reference in their entirety.

FIELD OF THE INVENTION

This invention relates to a tunable amplified spontaneous emission (ASE) laser source comprising at least two laser sources excited by a single pump laser. More particularly, the present invention relates to a tunable amplified spontaneous emission (ASE) laser source comprising at least two laser sources excited by a single pump laser wherein said at least two laser sources each comprise an organic laser or a cascaded organic laser. The invention is used for providing a tunable amplified spontaneous emission (ASE) laser source comprising at least two laser sources excited by a single pump laser.

BACKGROUND OF THE INVENTION

In many high precision systems, any minute displacements or fine movements in its structures and guidance systems can result in undesirable results at its best of times, or disastrous results at its worst of times. In such systems, such as the Very Large Hadron Collider (VLHC), which is a superconducting proton-to-proton collider comprising a 27 kilometers synchrotron designed to collide two opposing particle beams of protons, any minute displacements of its complex arrays of beam guides will result in major and very costly failures. Currently there are very few techniques that can provide accurate monitoring and detection of such minute displacements in such systems. In the few prior art that exists, such systems are either very complex to implement and/or cannot be up-scaled to monitor a large establishment.

There is a need for a simple, effective, accurate and scalable method of detecting, monitoring and measuring even very minute displacements and fine movements of systems in physical spaces.

Citation or identification of any reference in this section or any other section of this application shall not be construed as an admission that such reference is available as prior art for the present application.

SUMMARY OF THE INVENTION

The present invention provides a method to tune multiple color emissions from an organic laser and using such tuning to measure displacements and movements. In a first aspect of the present invention there is provided a use of a cascaded organic laser to produce tunable multiple color emissions that is used to measure very fine displacements and minute movements in physical space. In a second aspect of the present invention there is provided a method to obtain accurate and fine measures of displacements and minute movements in physical space for applications wherein such movements are of interest. In a third aspect of the present invention there is provided a system to provide such detection, monitoring and measurement in a scalable manner across large physical and/or geographical spaces.

In one aspect of the present invention, there is provide a tunable amplified spontaneous emission (ASE) laser source comprising at least two laser sources excited by a single laser pump wherein each of said at least two laser sources comprise an organic laser or a cascaded organic laser.

In a first embodiment of the one aspect of the present invention there is provided a tunable amplified spontaneous emission (ASE) laser source wherein said organic laser or said cascaded organic laser is a thin film laser generating device.

In a second embodiment of the one aspect of the present invention there is provided a tunable amplified spontaneous emission (ASE) laser source wherein said organic laser or said cascaded organic laser comprises at least blue and green emission organic semiconductors.

In a third embodiment of the one aspect of the present invention there is provided a tunable amplified spontaneous emission (ASE) laser source wherein one of the at least two laser sources comprises a thin film laser generating device comprising Poly (9, 9-di-n-dodecylfluorenyl-2, 7-diyl) and the other of the at least two laser sources comprises a thin film laser generating device comprising Poly [(9, 9-di-n-octylfluorenyl-2, 7-diyl)-alt-(benzo[2,1,3]thiadiazol-4,8-diyl)].

In a fourth embodiment of the one aspect of the present invention there is provide a tunable amplified spontaneous emission (ASE) laser source wherein the single laser pump comprises a third harmonic laser from Nd:YAG.

In a fifth embodiment of the one aspect of the present invention there is provide a tunable amplified spontaneous emission (ASE) laser source wherein the single laser pump comprises a pulsed UV emission laser.

In a sixth embodiment of the one aspect of the present invention there is provide a tunable amplified spontaneous emission (ASE) laser source wherein one of the at least two laser sources comprises a thin film laser generating device of lasing organic material comprising Poly (9, 9-di-n-dodecyl-fluorenyl-2, 7-diyl) and the other of the at least two laser sources comprises a thin film laser generating device comprising Poly [(9, 9-di-n-octylfluorenyl-2, 7-diyl)-alt-(benzo [2,1,3]thiadiazol-4,8-diyl)] and wherein the single laser pump comprises a pulse laser which further comprising a third harmonic laser comprising Nd:YAG.

In a seventh embodiment of the one aspect of the present invention there is provided a tunable amplified spontaneous emission (ASE) laser source wherein said organic laser or said cascaded organic laser comprises from at least blue and green emission organic semiconductors and wherein the single laser pump comprises a pulsed UV emission laser.

In an eighth embodiment of the one aspect of the present invention there is provided a tunable amplified spontaneous emission (ASE) laser source wherein at least one of the at least two laser sources is a two-dimensional paired laser element.

In a ninth embodiment of the one aspect of the present invention there is provided a tunable amplified spontaneous emission (ASE) laser source wherein each of the at least two laser sources is a two-dimensional paired laser element.

In another aspect of the present invention, there is provide a method of operating a tunable ASE laser source comprising: emitting an optical pulse from a pulsed laser pump source to a thin film laser device comprising at least first and second cascaded organic thin films; emitting a first laser pulse from the first organic thin film at a first time slot; emitting a second laser pulse from the second organic film at a second time slot; wherein a time delay between the first time slot and the second time slot is a picosecond or less.

In a first embodiment of another aspect of the present invention there is provided a method of operating a tunable ASE laser source wherein the first organic thin film comprises Poly (9, 9-di-n-dodecylfluorenyl-2, 7-diyl) and the second organic thin film comprises Poly [(9, 9-di-n-octylfluorenyl-2, 7-diyl)-alt-(benzo[2,1,3]thiadiazol-4,8-diyl)].

In a second embodiment of another aspect of the present invention there is provided a method of operating a tunable ASE laser source wherein at least one of the at least two laser sources is a two-dimensional paired laser element.

In a third embodiment of another aspect of the present invention there is provided a method of operating a tunable ASE laser source wherein each of the at least two laser sources is a two-dimensional paired laser element.

The method for measuring displacements and movements comprises tuning multiple color emissions from a laser such that the tuned multiple color emissions of the laser are used to measure said displacements and said movements. Said laser comprises an organic laser and/or a cascaded organic laser. Said measured displacements include very fine displacements and said measured movements include very minute movements. Furthermore, said method is scalable in order to support the measuring of displacements and movements across one or more physical/geographical spaces including very large physical and/or geographical spaces.

The system for measuring displacements and movements comprises one or more measuring means at least configured to tune multiple color emissions from a laser such that the tuned multiple color emissions of the laser are used to measure said displacements and said movements. Said laser comprises an organic laser and/or a cascaded organic laser. Said measured displacements include very fine displacements and said measured movements including very minute movements. In addition, said system is scalable in order to support the measuring of displacements and movements across one or more physical/geographical spaces including very large physical and/or geographical spaces.

Throughout this specification, unless the context requires otherwise, the word "include" or "comprise" or variations such as "includes" or "comprises" or "comprising", will be understood to imply the inclusion of a stated integer or group of integers but not the exclusion of any other integer or group of integers. It is also noted that in this disclosure and particularly in the claims and/or paragraphs, terms such as "included", "comprises", "comprised", "comprising" and the like can have the meaning attributed to it in U.S. Patent law; e.g., they can mean "includes", "included", "including", and the like; and that terms such as "consisting essentially of" and "consists essentially of" have the meaning ascribed to them in U.S. Patent law, e.g., they allow for elements not explicitly recited, but exclude elements that are found in the prior art or that affect a basic or novel characteristic of the present invention.

Furthermore, throughout the specification and claims, unless the context requires otherwise, the word "include" or variations such as "includes" or "including", will be understood to imply the inclusion of a stated integer or group of integers but not the exclusion of any other integer or group of integers.

Other definitions for selected terms used herein may be found within the detailed description of the present invention and apply throughout.

Unless otherwise defined, all other technical terms used herein have the same meaning as commonly understood to one of ordinary skill in the art to which the present invention belongs.

Other aspects and advantages of the present invention will be apparent to those skilled in the art from a review of the ensuing description.

BRIEF DESCRIPTION OF THE DRAWINGS

The above and other objects and features of the present invention will become apparent from the following description of the present invention, when taken in conjunction with the accompanying drawings, in which.

DETAILED DESCRIPTION OF THE INVENTION

Figure 1:
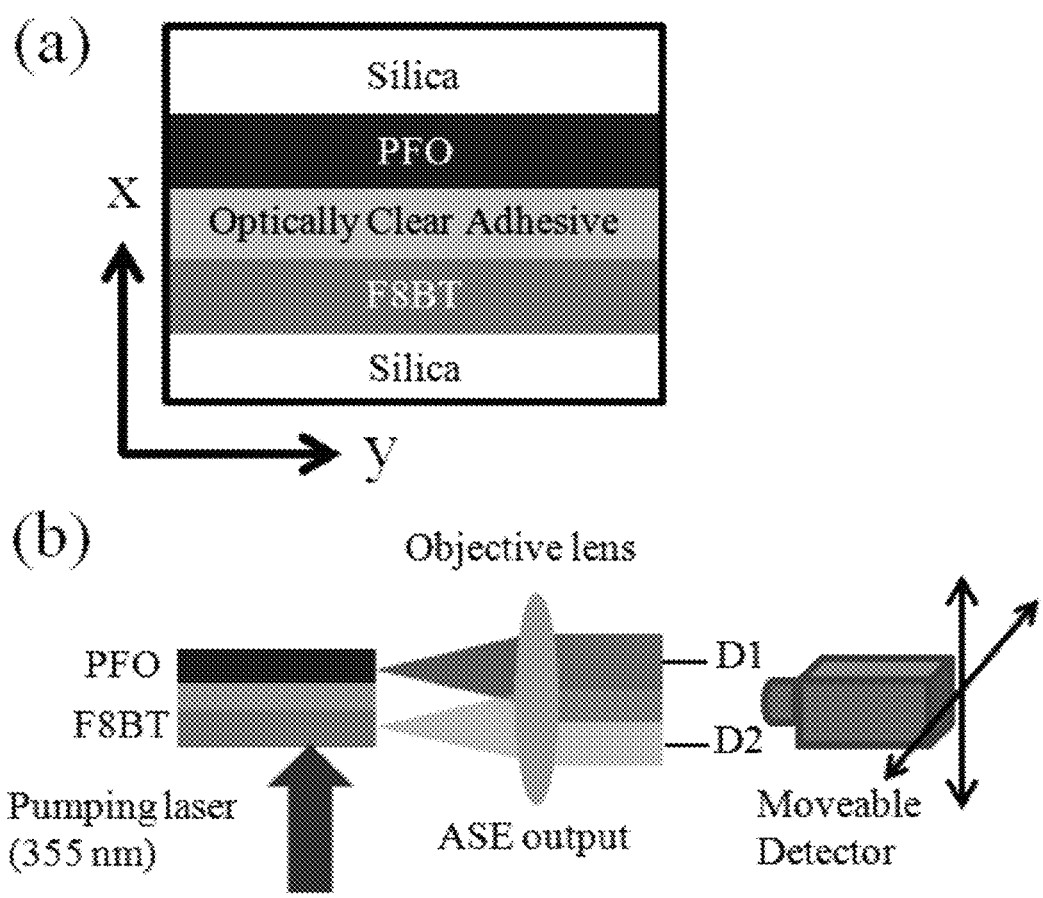
FIG. 1 shows (a) Cross-section of cascaded films with PFO (120 nm), F8BT (250 nm), optically clear adhesive (60 μm), and silica (1 mm); (b) ASE measurement configuration, the cascaded films is pumped with Nd:YAG laser (355 nm, 10 Hz) and the excitation area is 5 mm×300 μm; and the ASE output is collected from the edge of the sample by the fiber coupled spectrometer.

The presently claimed invention is further illustrated by the following experiments or embodiments which should be understood that the subject matters disclosed in the experiments or embodiments may only be used for illustrative purpose but are not intended to limit the scope of the presently claimed invention.

Without wishing to be bound by theory, the inventors have discovered through their trials, experimentations and research that to accomplish the task of tuning multiple color emissions from an organic laser and using such tuning to measure displacements and movements.

Tunable Color Emission: White Light Amplified Simultaneous Emission

Semiconducting (conjugated) polymer draws much attention nowadays as it is a promising possible application. With increasing emission efficiency, excited emission such as ASE (amplified spontaneous emission) and lasing have been achieved. Recently, the white ASE has been reported but with one ASE spectrum and one much broader spectrum. In this invention, the gain media in optical amplifiers will be studied. Two individual shape ASE spectra in one sample will be demonstrated.

A first aspect of the present invention aims at getting white light ASE with two different color ASE spectra that have near-equal spectral profiles. Two lasing organic materials, Poly (9, 9-di-n-dodecylfluorenyl-2, 7-diyl) (PFO) and Poly [(9, 9-di-n-octylfluorenyl-2, 7-diyl)-alt-(benzo[2,1,3]thiadiazol-4,8-diyl)] (F8BT) were selected. The corresponding peaks of PFO and F8BT are at 450 nm and 575 nm, respectively, and the full width half maximum are 5 nm and 10 nm. Therefore, they are suitable to be combined to give a white ASE. A PFO thin film was first deposited onto a glass substrate, and then a high transmittance optically clear adhesive (over than 90% transmittance in visible range) was added as a spacer that separates it from the F8BT thin film. The sample successfully demonstrated white light ASE when pumped by a 355 nm third harmonic laser from Nd:YAG. The CIE coordinate achieved is (0.36, 0.45) and a comparable threshold.

In conclusion, it is shown that a simple thin film configuration that can produce white light ASE was achieved and it is possible to tune the CIE coordinate from the thin film thickness. Such device can be used as a strong white light source in spectroscopy experiments.

Tunable Color Emission from Cascaded Amplified Spontaneous Emissions in Organic Thin Films Since the demonstrations of the semiconducting (conjugated) polymer light emitting diodes, semiconducting (conjugated) polymer draws lots of attention as promising gain materials in lasing applications. In the second aspect of the present invention, we demonstrated the Amplified Spontaneous Emission (ASE) processes can be used to realize tunable emission spectra of a cascaded organic thin film system, consisting of blue and green emission organic semiconductors. When the cascaded films were pumped by a pulsed UV emission laser, the directional emission of ASE from the two kinds of materials are partially overlapped in the far field. The emission spectra can be tuned almost linearly in the CIE coordinates from (0.42, 0.55) to (0.18, 0.11) by spatially choosing the emission signals. The method shown herein can be used to design a polychrome light source for display, bio-imaging and related applications.

Experimental Details

Sample Structure (FIG. 1a):
Silica/PFO/Optically Clear Adhesive (OCA)/F8BT/Silica.

Condition:
Using Toluene as solvent and Spin-coating for fabrication.
PFO (Poly(9, 9-di-n-dodecylfluorenyl-2, 7-diyl): 16 mg/ml, 120 nm.
F8BT (Poly[(9, 9-di-n-octylfluorenyl-2, 7-diyl)-alt-(benzo[2,1,3]thiadiazol-4,8-diyl)]): 23 mg/ml, 250 nm.
Optically Clear Adhesive (OCA): 60 μm, n=1.48.

Experiment (FIG. 1b)

Pumped by Nd:YAG laser (λ=355 nm, repetition rate:10 Hz and pulse width:5 ns).
Excitation Area: 5 mm×300 μm.
The spontaneous emission and ASE signals from Sample were collected at edge of the device and analyzed by a fiber coupled spectrometer (Ocean Optics, USB 4000).
Using a photodiode to monitor and calibrate the pumping power of the laser.

Experimental Results

Figure 2:
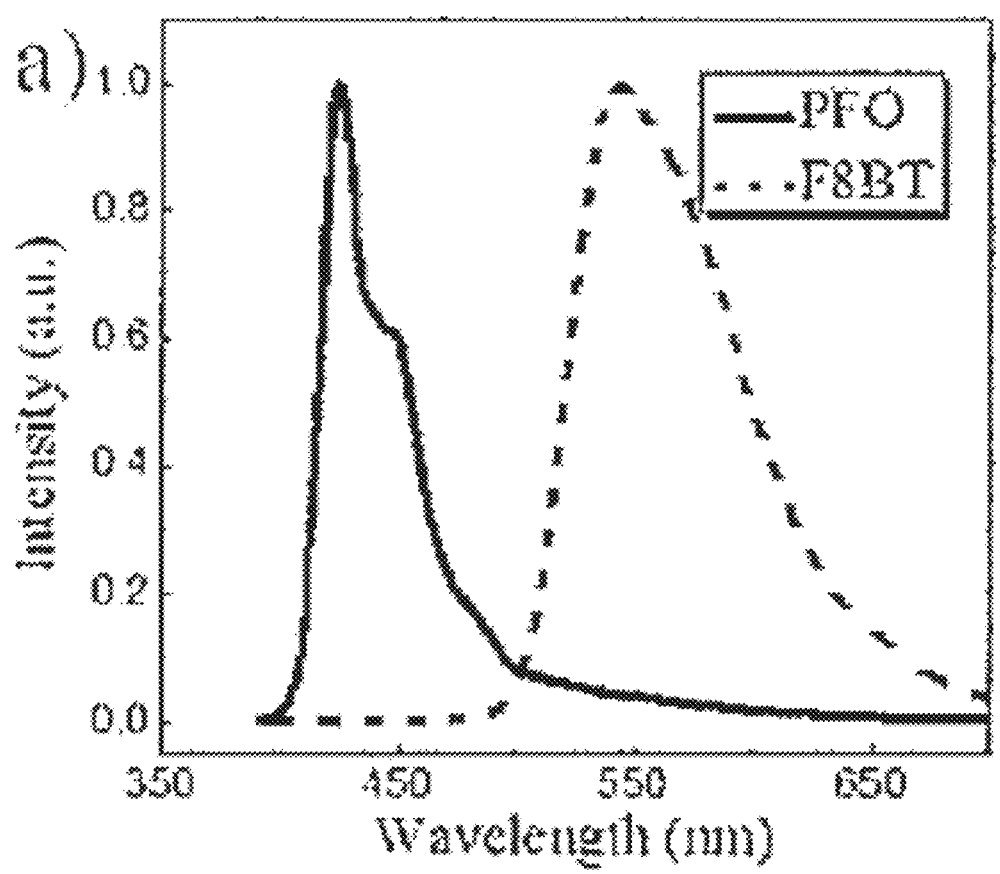
FIG. 2 shows (a) Photoluminescence spectra of PFO and F8BT; (b) Transmittance of (i) PFO (120 nm, filled squares), (ii) F8BT (250 nm, filled circles), (iii) Optically Clear Adhesive (60 μm, open squares) and (iv) Cascaded PFO (120 nm)/F8BT (250 nm) films (open circles)
Figure 2:
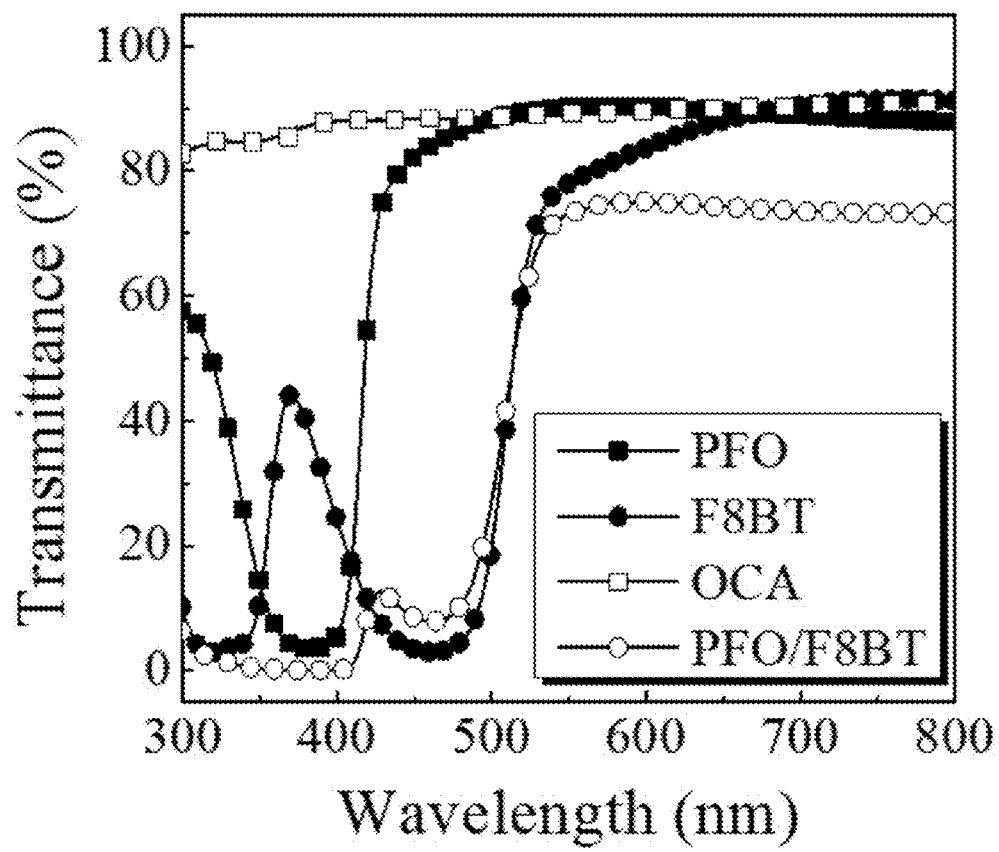
Figure 3:
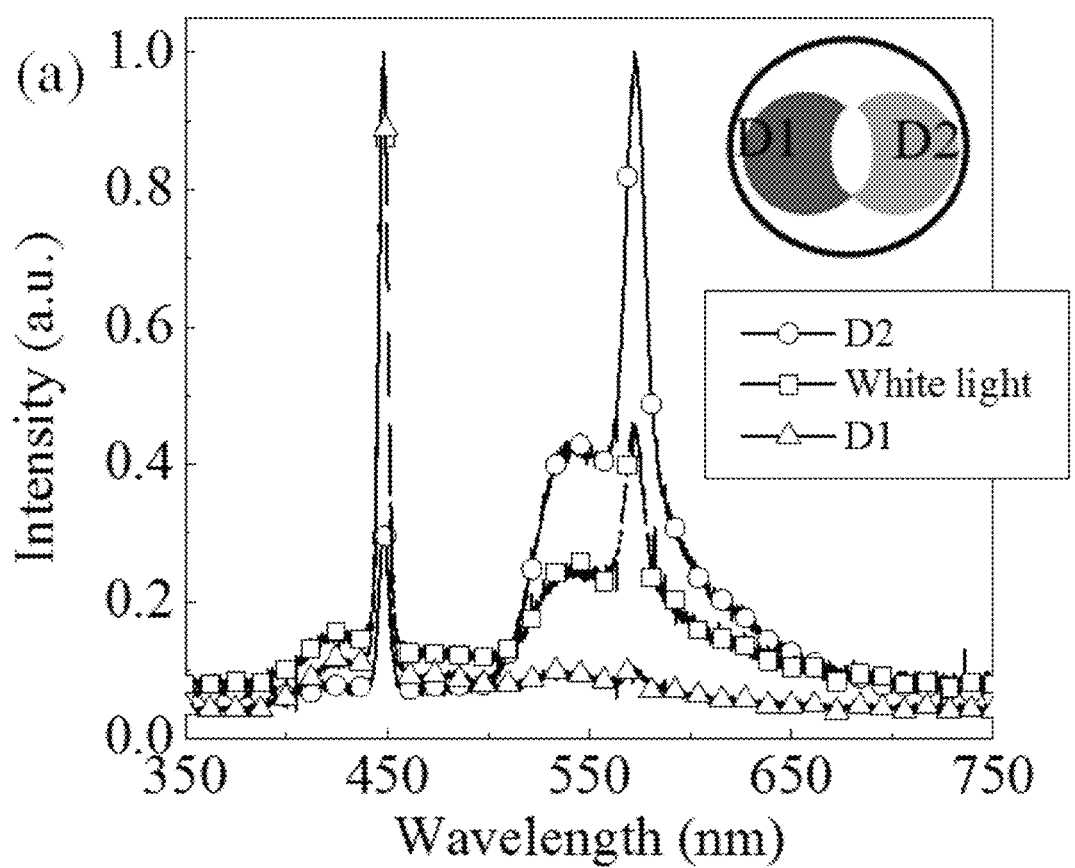
FIG. 3 shows the normalized ASE spectra in different positions from edge of the sample with pumping power density at 0.53 mW/cm$^2$; (a) the cross-section of the receiving fiber with the position located; (b) Power dependence of PFO; (c) Power dependence of F8BT.
Figure 3:
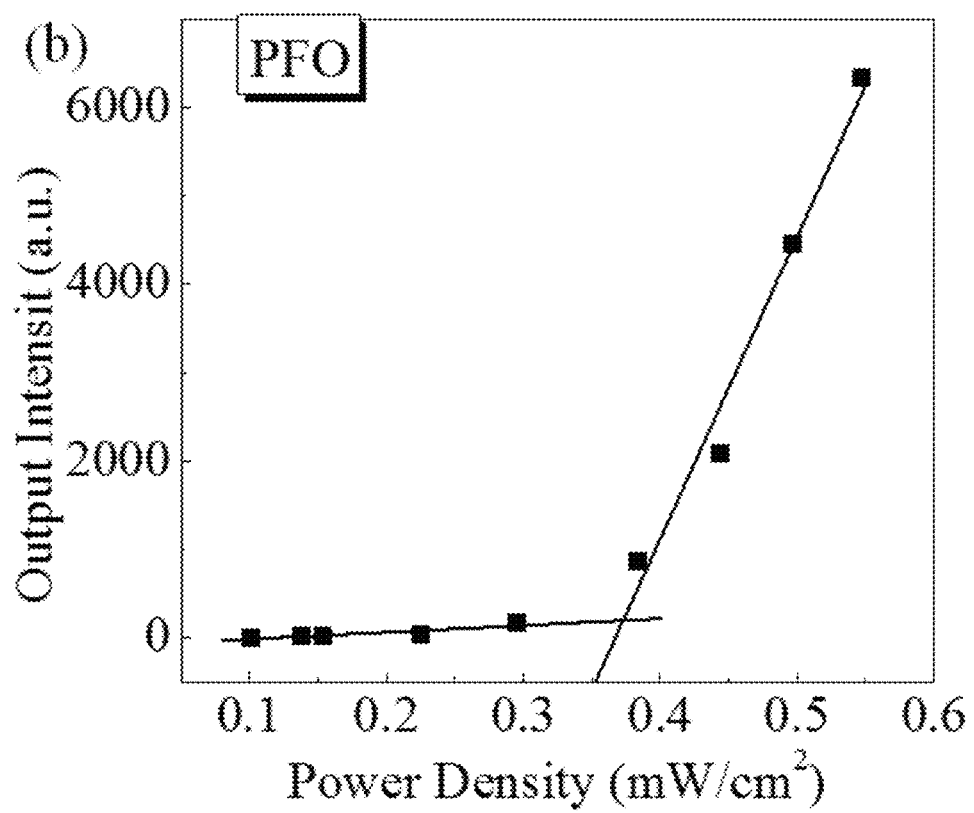
Figure 3:
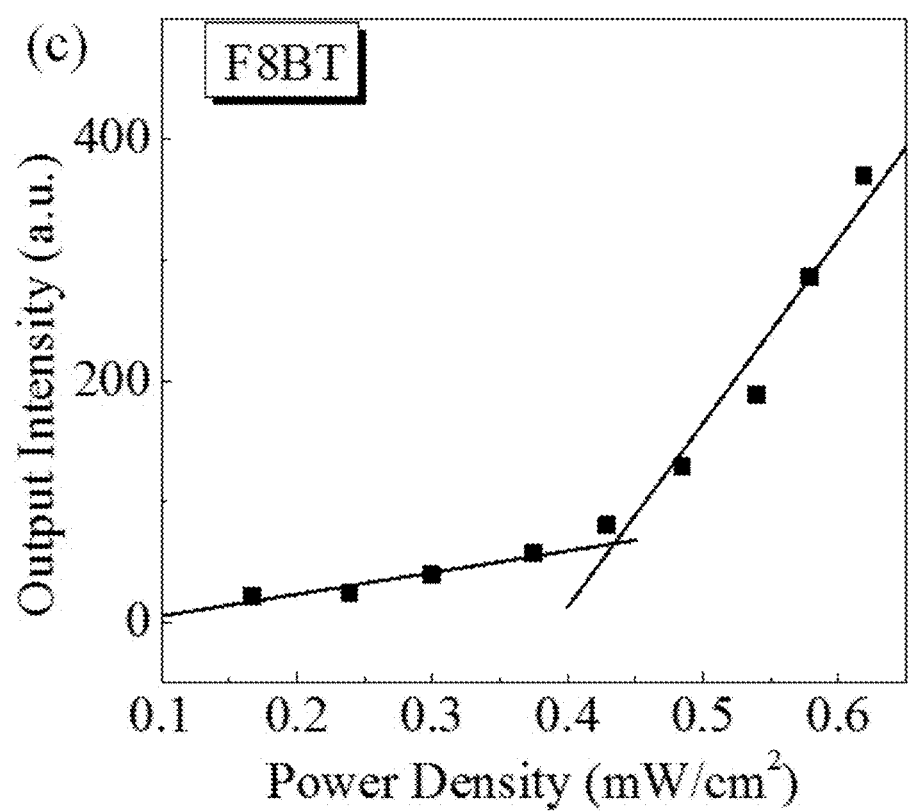
Figure 4:
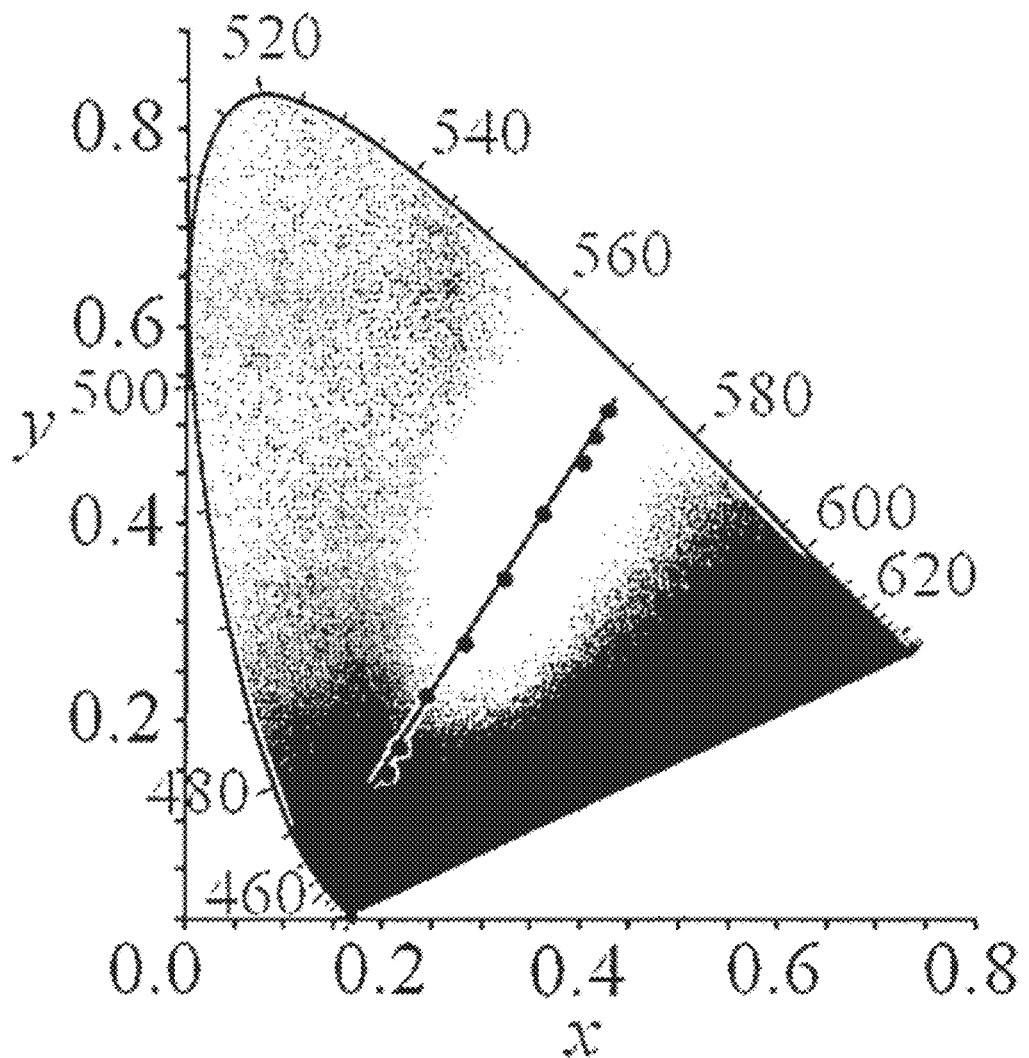
FIG. 4 shows the diagram of the CIE color space.
Figure 5:
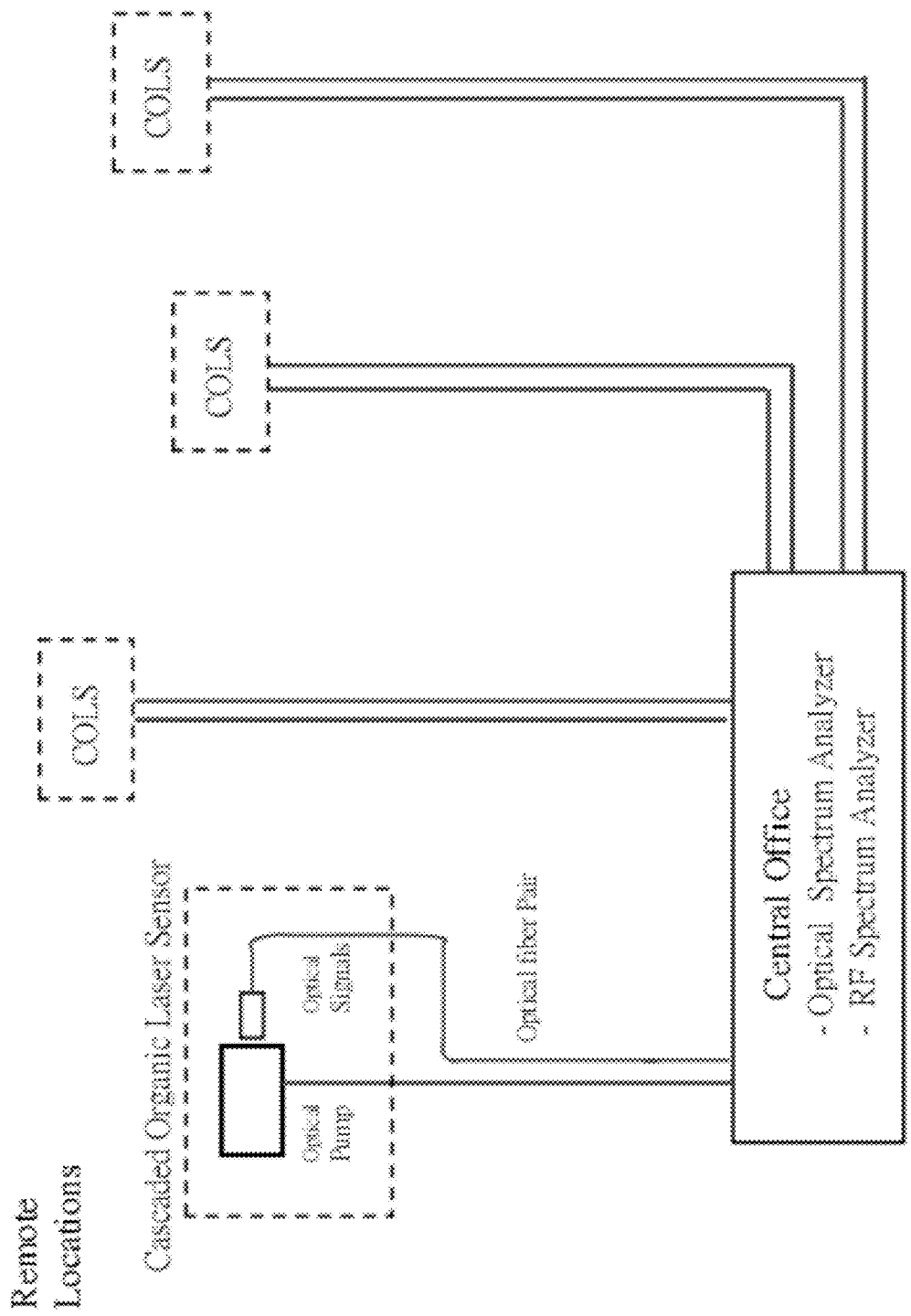
FIG. 5 shows the schematic illustration of remote position, vibration, and rotational-motion movement.

The photoluminescence (PL) spectra of PFO and F8BT (FIG. 2a):
Under a condition of being pumped by He—Cd laser (λ=325 nm).
The transmission efficiency of the optical adhesive, PFO, F8BT and PFO/F8BT cascaded films (FIG. 2b):
Showing that the wavelength of the pump laser (355 nm) is located in absorption region of both PFO and F8BT films.
ASE measurement:
The ASE signals from PFO ($ASE_{PFO}$) and F8BT ($ASE_{F8BT}$) were separated in the near field by the OCA, and the two directional emissions were then imaged in the far field.
As shown in FIG. 3a, the total ASE spectra (pumping density: 0.53 mW/cm$^2$) strongly depend on the spatial distribution of the two overlapped emission beams.
The power dependence ASE at D1 and D2 positions (FIG. 3b, FIG. 3c):
At low pumping power, the spontaneous emission in both PFO and F8BT are dominant. By increasing the pumping power, the PL spectra show clearly the thresholds of ASE process (0.37 mW/cm$^2$ for PFO and 0.43 mW/cm$^2$ for F8BT).
Commission Internationale d'Eclairage (CIE) coordinates (FIG. 4):
The color of the output ASE changes as the collection fiber moves from D1 to D2.
The black dots represent the CIE coordinate of the specific spectrum.
The CIE coordinates can be tuned from (0.42, 0.55) to (0.18, 0.11) with a linear relation. The color of the ASE emission passes very close to the centre of CIE coordinates (0.32, 0.35), which is for white light emission.
Findings
We have demonstrated a device made of cascaded organic semiconducting films. The ASE from the two kinds of materials can be obtained after being pumped by a single laser beam. The tunable emission spectrum of ASE was achieved in the far field with tunable CIE coordinates from (0.42, 0.55) to (0.18, 0.11). The device has great potential to be used as a polychrome light source in display, imaging and bio-sensing applications.
Remote Measurement Schemes
The schematic illustration is shown in FIG. 5. Cascaded organic laser sensors (COLS) at different locations are connected to a central office by optical fibers for remote measurement of different subjects. It follows that the real-time information from the subjects can be directly transferred to the central office, and the central office can simultaneously monitor all the subjects in a single location. For the measurement, the central office provides pump laser, optical spectrum analyzer, RF spectrum analyzer, optical switches, photodetectors and optical filters. It is worth indicating that the COLS is a passive device, and no electrical power is needed, so that the COLS can be used at any location without a need for power supply. Furthermore, the remote measurement scheme is scalable in the sense that a greater number of COLS may be installed from time to time in order to perform measurement across one or more physical/geographical spaces, which may include very large physical and/or geographical spaces.

Figure 6:
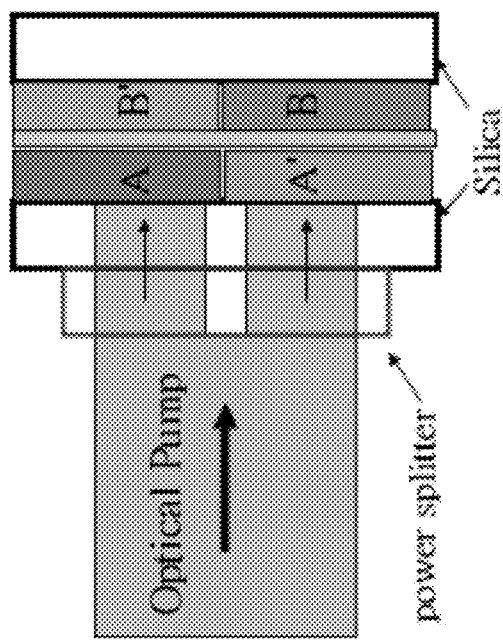
FIG. 6 shows the cascaded organic laser configurations.
Figure 6:
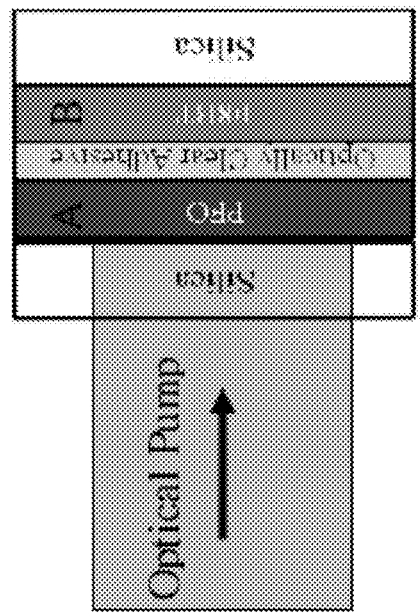

FIG. 6 shows the cascaded organic laser configurations. There are 2 types of cascaded organic lasers, comprising organic thin films as shown in FIGS. 6(a) and (b), respectively. The first type shown in FIG. 6a is for measurement of x and z directions OR y and z directions, whereas the second type shown in FIG. 6b is for measurement of x, y and z directions.

Examples of Organic Laser Sensors:

(a) Sensor for 2 Axis Position and Vibration Measurement

Figure 7:
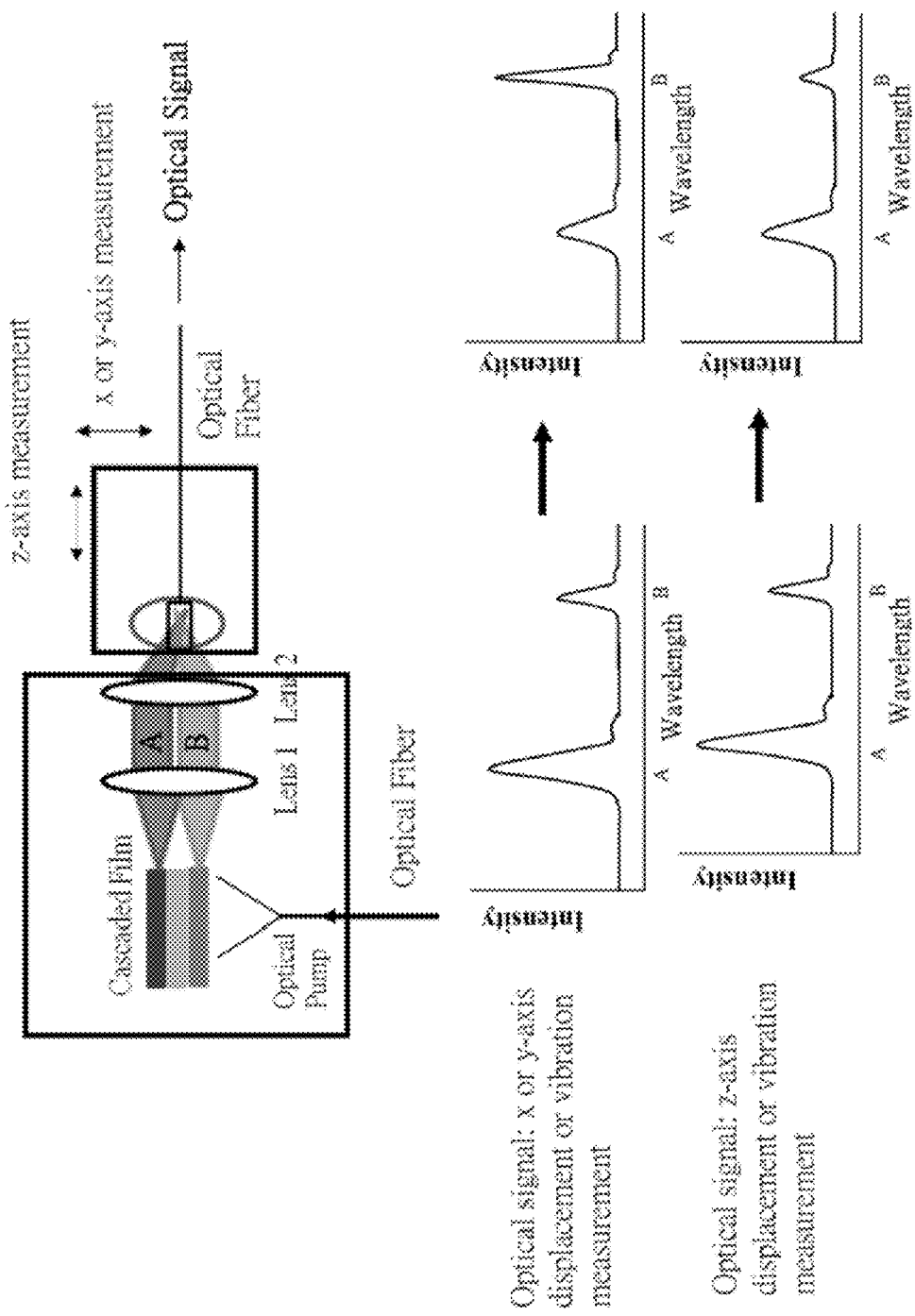
FIG. 7 shows the optical sensor configuration (2-axis position and vibration measurements)

FIG. 7 shows the optical sensor configuration of a COLS for 2 axis position and vibration measurement. In the sensor, the multiwavelength laser beams or Amplified Spontaneous Emission (ASE) are spatially overlapped and focused on an optical fiber. Since the optical fiber has a defined aperture, it can control the measurement accuracy of the sensor. When the subject moves along x- or y-axis as shown in FIG. 7, the optical fiber can receive the different intensity changes at wavelengths A and B. With calibration of the intensity distribution at A and B against position, real-time displacement of the subject can be monitored.

In addition, when the subject moves along the z-axis, the optical fiber will receive the intensity changes at both wavelengths A and B. Again, with calibration of the intensity changes at A and B against displacement, real-time displacement of the subject at the z direction can be monitored.

Besides the position measurement, by using the RF spectrum analyzer, photo-detector and optical filter, the vibration frequency of the subject can also be directly detected at both the z-axis and the x- or y-axis.

(b) Sensor for 3-Axis Position and Vibration Measurements

Figure 8:
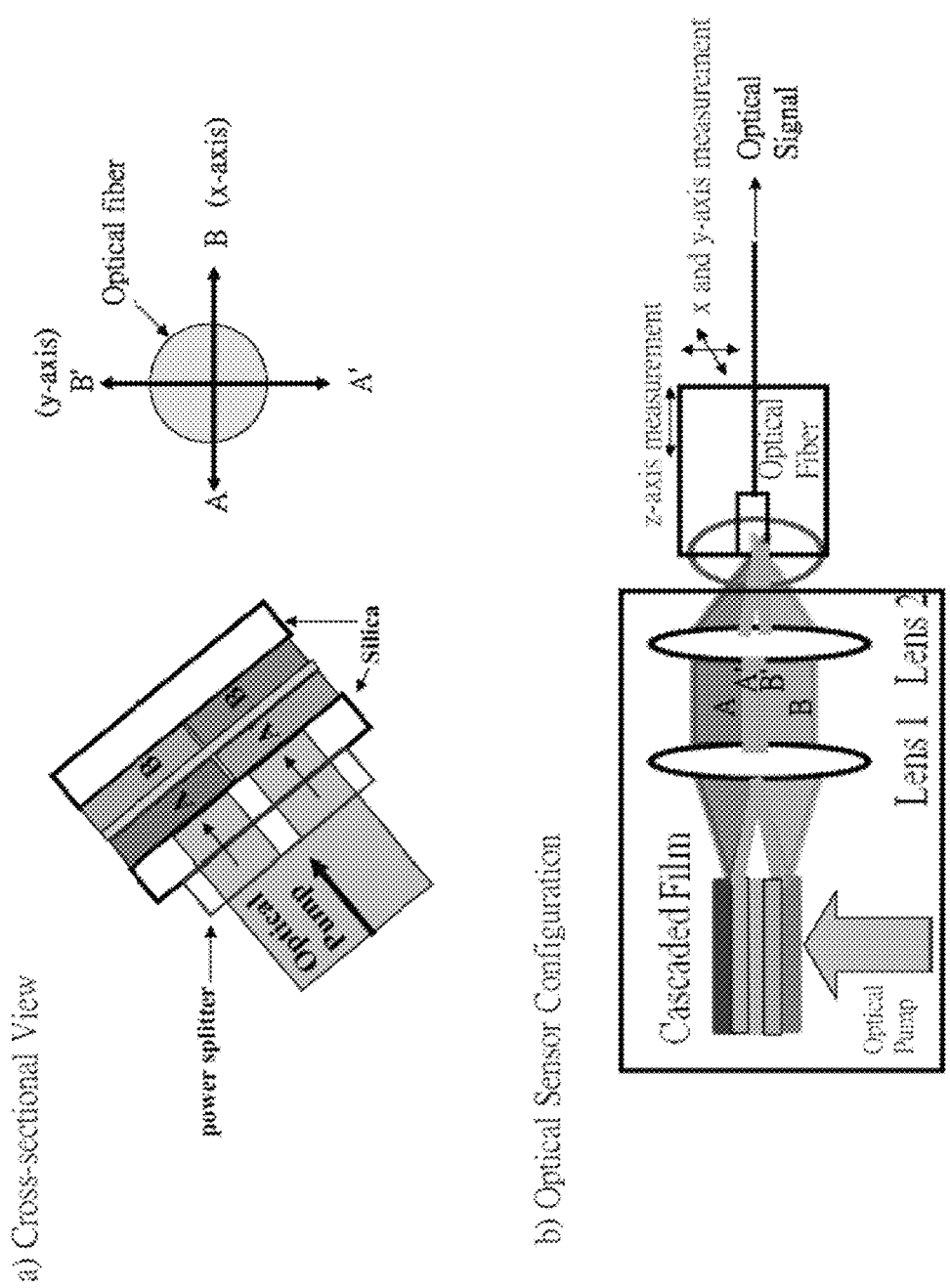
FIG. 8 shows the optical sensor configuration (3-axis position and vibration measurements)
Figure 8:
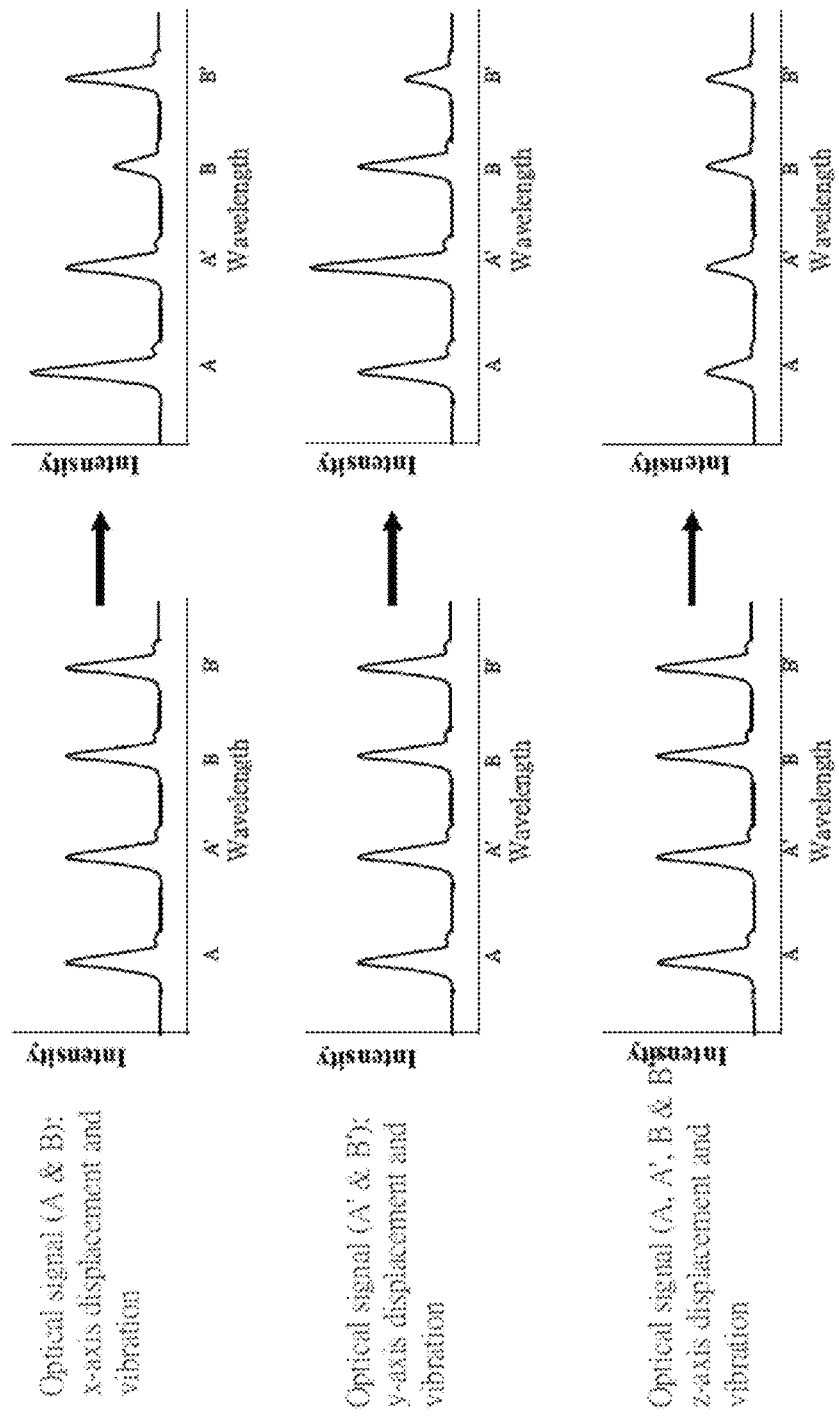

FIG. 8 illustrates the optical sensor configuration of a COLS for 3-axis position and vibration measurements.

FIG. 8(a) shows the cross-sectional view of the organic laser and fiber position, in which the organic laser is installed at 45 degree against the x-axis and y-axis.

FIG. 8(b) shows the optical sensor configuration.

(i) X-Axis Monitoring

The wavelength pair A and B is assigned for measuring the x-axis position and vibration. When the subject moves along the x-direction, the position of optical fiber is changed. The received optical signals at wavelengths A and B are also changed accordingly. Therefore, with calibration of the intensity changes at A and B against position, the real-time displacement of the subject can be monitored. The optical signal changes are depicted in FIG. 8(c).

(ii) Y-Axis Monitoring

The wavelength pair A' and B' is assigned for measuring the y-axis position and vibration. When the subject moves along the y-direction, the position of the optical fiber is changed. The received optical signals at wavelengths A' and B' are also changed accordingly. Therefore, with calibration of the intensity changes at A' and B' against position, the real-time displacement of the subject can be monitored. The optical signal changes are depicted in FIG. 8(c).

(iii) Z-Axis Monitoring

At the same time, the intensities of wavelengths A, A', B and B' are also sensitive to the z-axis position change. When the subject moves along the z-direction, the received optical signals at wavelengths A, A', B and B' are changed as shown in FIG. 8(c). Therefore, with calibration of the intensity changes for A, A', B and B' against position, the real-time displacement of the subject can be simultaneously monitored.

(iv) Vibration Measurement

Again, by using the RF spectrum analyzer, photo-detector and optical filters, the vibration frequency of the subject at x, y and z directions can also be monitored.

(c) Sensor for Rotational Motion Measurement

Figure 9:
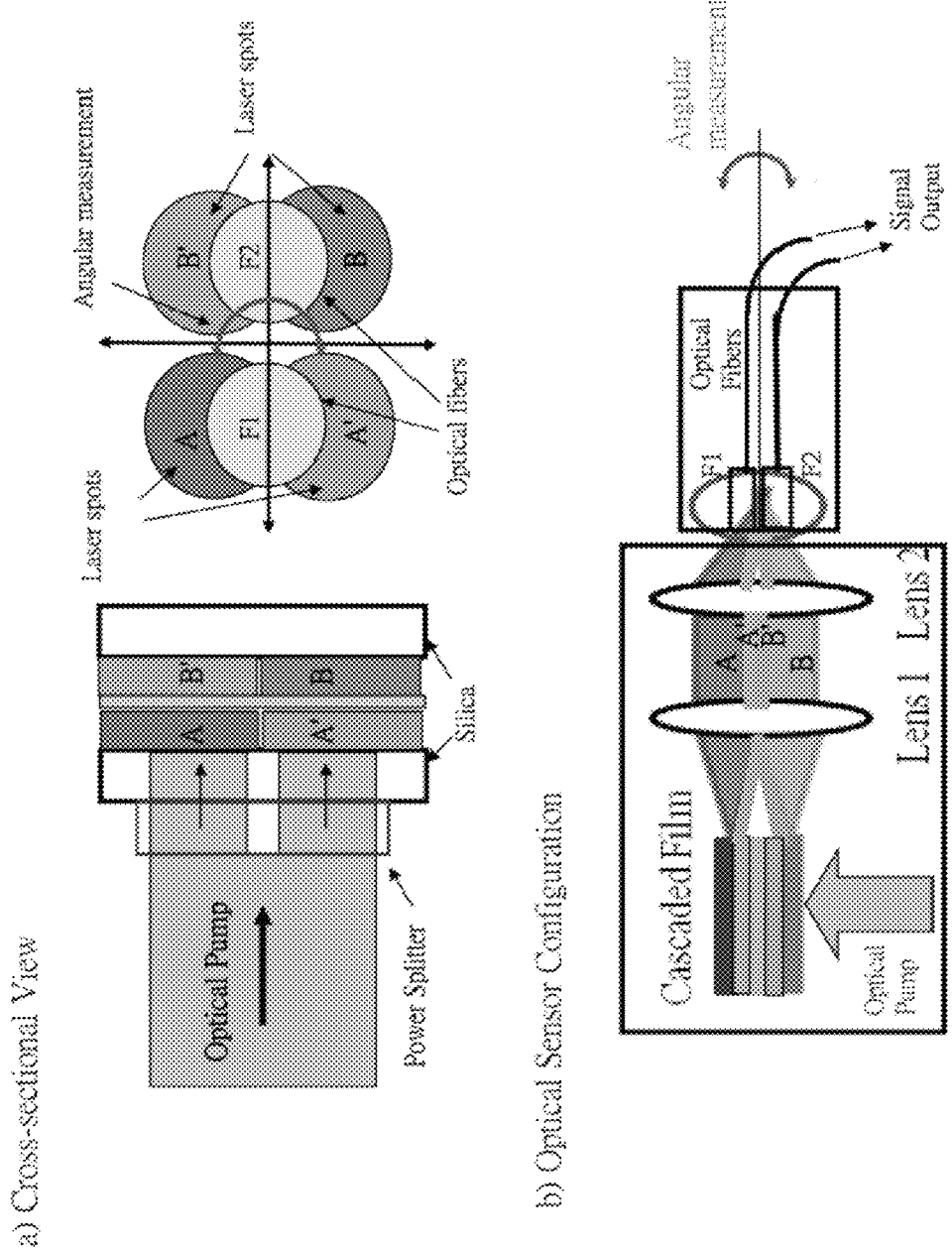
FIG. 9 shows the optical sensor configuration (rotational motion measurement)
Figure 9:
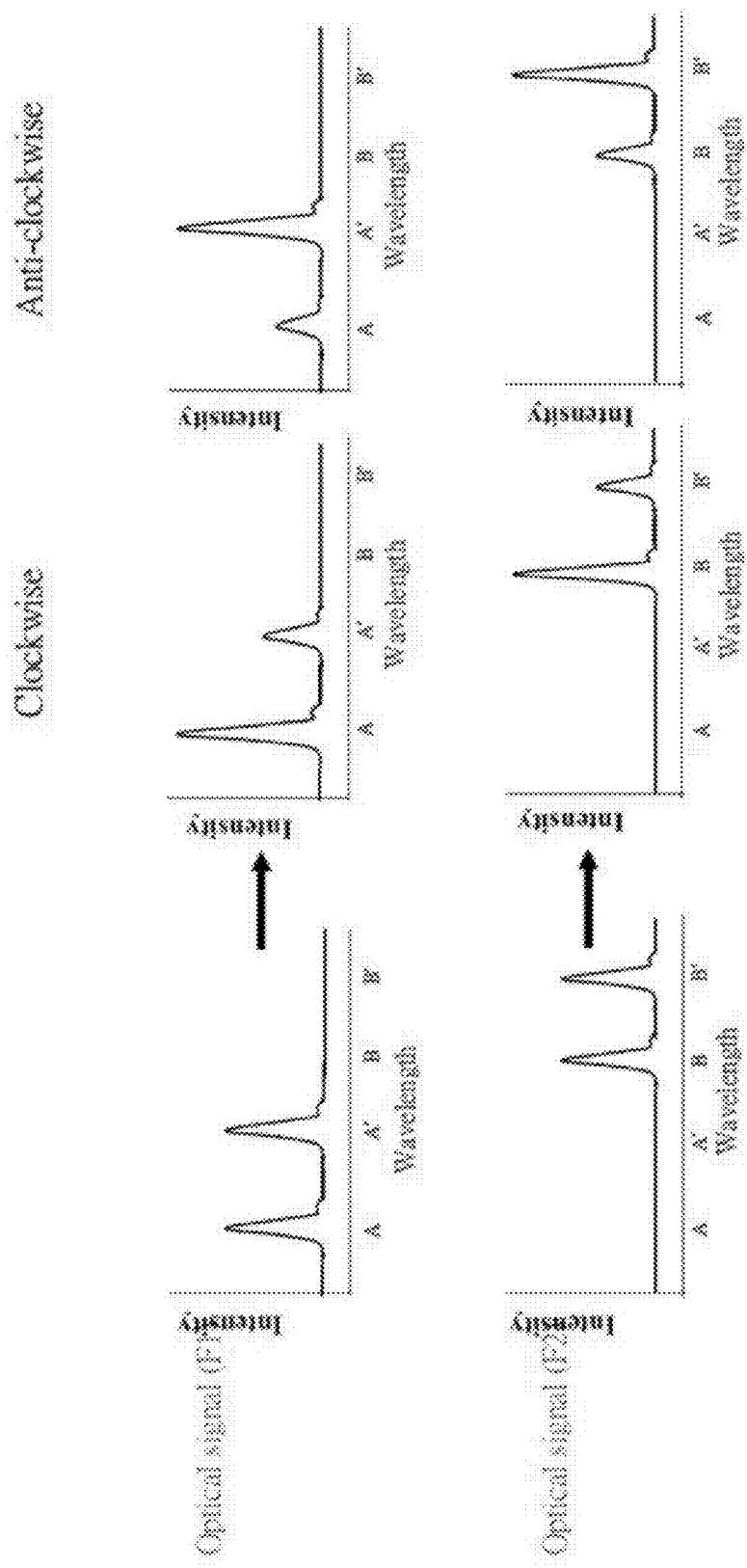

FIG. 9 shows the optical sensor configuration for rotational motion measurement.

FIG. 9(a) illustrates the cross-sectional view of the sensor, in which the organic-laser thin film pairs AA' and BB' are aligned with respect to the optical fibers F1 and F2, respectively. The rotation axis is located between optical fibers F1 and F2. FIG. 9(b) shows the optical sensor configuration for rotational motion measurement.

Clockwise Rotation Measurement

When the subject is rotated clockwise about the rotation axis, both fiber F1 and F2 can receive the intensity changes at wavelengths AA' and BB', respectively. Under this situation, the received intensities at wavelengths A and B are increased, and received intensities at wavelengths A' and B' are decreased. FIG. 9(c) shows the optical signals.

Anti-Clockwise Rotation Measurement

When the subject is rotated anti-clockwise about the rotation axis, both fiber F1 and F2 can receive the intensity changes at wavelengths AA' and BB', respectively. Under this situation, the received intensities at wavelengths A and B are decreased, and received intensities at wavelengths A' and B' are increased. FIG. 9(c) shows the optical signals.

Therefore, with the calibration of the intensity changes for A, A', B and B' against angle, real-time angular change of the subject can be measured. In addition, by using the RF spectrum analyzer, photo-detector and optical filters, the angular frequency of the subject at the rotation axis can also be monitored.

(d) Multiwavelength Pulsed Organic Laser for Remote Pump-Probe Test

Figure 10:
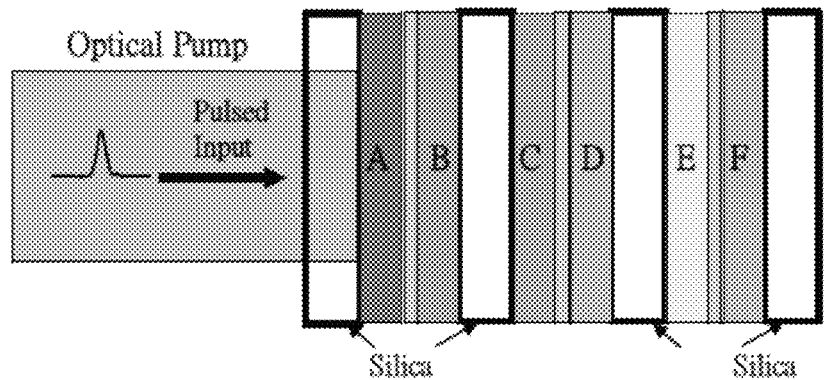
FIG. 10 shows the multiwavelength organic laser source for pump-probe test.
Figure 10:
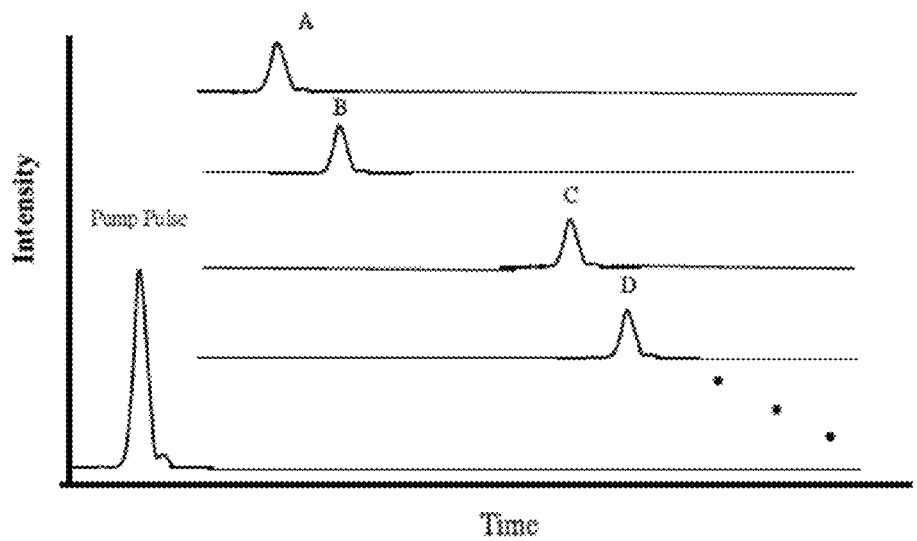
Figure 10:
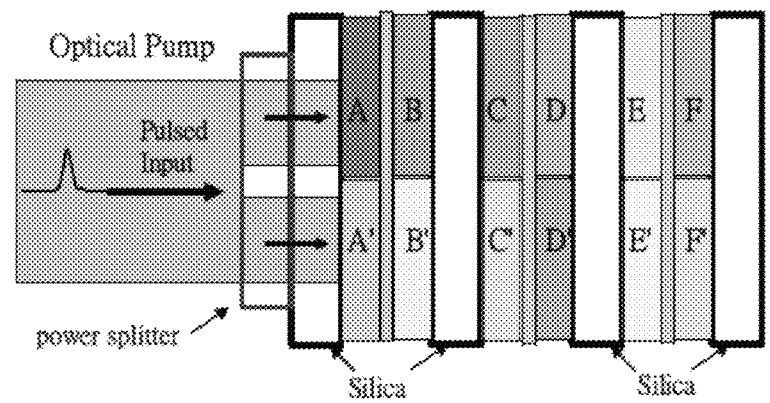
Figure 10:
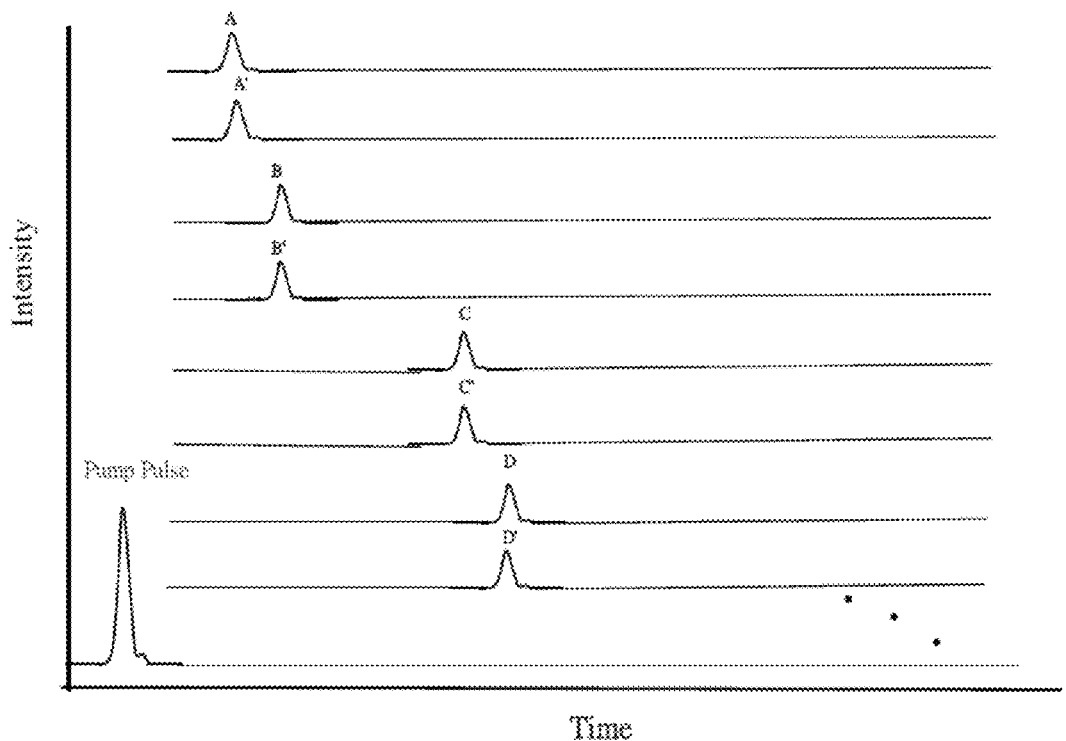

Two configurations of multiwavelength pulsed organic laser source are shown in FIGS. 10(a) and (b), in which FIG. 10(a) provides cascaded organic lasers in linear architecture, and FIG. 10(b) provides cascaded organic lasers in two-dimensional architecture.

In general, when using a pulsed laser as an optical pump, the organic laser will emit an optical pulse accordingly. It follows that, in our configurations, when the optical pump pulse is incident on the laser device, it will be sequentially transmitted through the cascaded organic thin films. Therefore, each thin film is excited by the pump pulse at a different time slot. As a result, each thin film will emit the laser pulse with a sequential time delay. The time sequences of output laser pulses are shown in FIG. 10(a). By precisely controlling the silica thickness of less than 1 mm, the output pulse delay-time can be precisely controlled at pico- to femto-second range. In FIG. 10(a), an embodiment of a cascaded organic lasers in linear architecture is constructed by first attaching a first lasing film (i.e. film A) onto a first silica film, then a first transparent bonding film is used to attach a second lasing film (i.e. film B) to the first lasing film (i.e.

film A). Then a second silica film is attached to the second lasing film. This is followed by attaching a third lasing film (i.e. film C) to the second silica film. A second transparent bonding film is then attached to the third lasing film (i.e. film C) and a fourth lasing film (i.e. film D) is attached to said second transparent bonding film. After that, a third silica film is attached to the fourth lasing film (i.e. film D) and a fifth lasing film (i.e. film E) is attached to the third silica film. A third transparent bonding film is then attached to the fifth lasing film (i.e. film E) and then a sixth lasing film (i.e. film F) is attached to said third transparent bonding film. Finally, a fourth silica film is attached to the sixth lasing film to complete the construct of the embodiment as shown in FIG. 10(a). It is understood by a person skilled in the art such cascaded organic lasers in linear architecture can be further cascaded with further layers of lasing films, transparent bonding films and silica films in the same order as the construct shown in FIG. 10(a). These pulse trains can be used for pump-probe tests, such as time-resolved infrared spectroscopy, transient-absorption spectroscopy, and time-resolved fluorescence spectroscopy. Furthermore, the new 2-dimensional configuration shown in FIG. 10(b) can also generate a pulse pair in a single time slot. The delay time between each pulse pair can also be precisely controlled at pico- to femto-second range. The output pulse sequence is shown in FIG. 10(b). The 2-dimensional configuration shown in FIG. 10(b) is similar in construct to the embodiment shown in FIG. 10(a), except that in the embodiment of FIG. 10(b), each lasing film is comprised of a pair of lasing elements, for example in the embodiment of FIG. 10(b), the first lasing film is comprised of a pair of lasing elements A and A', and the second lasing film is comprised of a pair of lasing elements B and B', and so forth. Other than this difference, the layered construct of the embodiment shown in FIG. 10(b) is similar to the layer construct of the embodiment shown in FIG. 10(a). Moreover, it is understood by a person skilled in the art such cascaded organic lasers in 2-dimensional configurations can be further cascaded with further layers of lasing films (each of which comprises paired lasing elements), transparent bonding films and silica films in the same order as the construct shown in FIG. 10(b). This multiwavelength pulsed outputs have potential applications in the multiple-pulse pump-probe test.

Experimental Details

We employed two different color materials in our experiment, the blue emission polymer PFO (Poly(9, 9-di-n-dodecylfluorenyl-2, 7-diyl) and green emission polymer F8BT (Poly[(9, 9-di-n-octylfluorenyl-2, 7-diyl)-alt-(benzo[2,1,3]thiadiazol-4,8-diyl)]). Those materials were purchased from Sigma-Aldrich. The molecule weight and polydispersity index of PFO are Mw 20000 and ~3.7, respectively. The average molecule weight of F8BT is ~10000-20000 and polydispersity index is <3. Both of the two materials were dissolved in toluene solution with concentrations of 16 mg/mL and 23 mg/mL, respectively. The polymer films were fabricated by spin-coating onto pre-cleaned fused silica substrates with thickness of 120 nm and 250 nm, respectively. As shown in FIG. 1a, the cascaded thin film system includes PFO and F8BT, which are bounded together via a 60 μm thick optically clear adhesive (OCA). The intention of adding the OCA is to totally separate the two materials so as to prevent any mixing. It is because both materials use the same solvent, toluene, and they may penetrate into each other. The refractive index of OCA is around 1.48, which is less than that of PFO and F8BT.

In the ASE experiment (FIG. 1b), the PFO/F8BT cascaded films were pumped by a third harmonic generation of Nd:YAG laser at wavelength $\lambda=355$ nm with a repetition rate of 10 Hz and a pulse width of 5 ns. The laser beam is firstly diverged by a concave lens, and then squeezed into a stripe beam by a cylindrical lens. Finally, the stripe beam was focused onto the device after cutting the non-uniform edges of the stripe laser spot using adjustable slits. The area size of the rectangular laser spot is 5 mm×300 μm. The spontaneous emission and ASE signals from PFO and F8BT were collected at edge of the device using the objective lens and analyzed by a fiber coupled spectrometer (Ocean Optics, USB 4000). The fiber coupled spectrometer also can be moved in x and y directions (shown in FIG. 1a) for detecting the output intensity. In FIG. 1b, D1 and D2 represent the highest intensity positions of PFO (450 nm) and F8BT (575 nm), respectively. In addition, a photodiode was used to monitor and calibrate the pumping energy of the laser.

RESULTS AND DISCUSSION

Before the experiment, we firstly tested the device's basic optical property. In FIG. 2, we characterized the transmission efficiency of the optically clear adhesive, PFO, F8BT and PFO/OCA/F8BT cascaded films. It shows that the OCA and cascaded films have a high transmittance for the pumping laser (355 nm), so that the device is suitable for the experiment.

Figure 11:
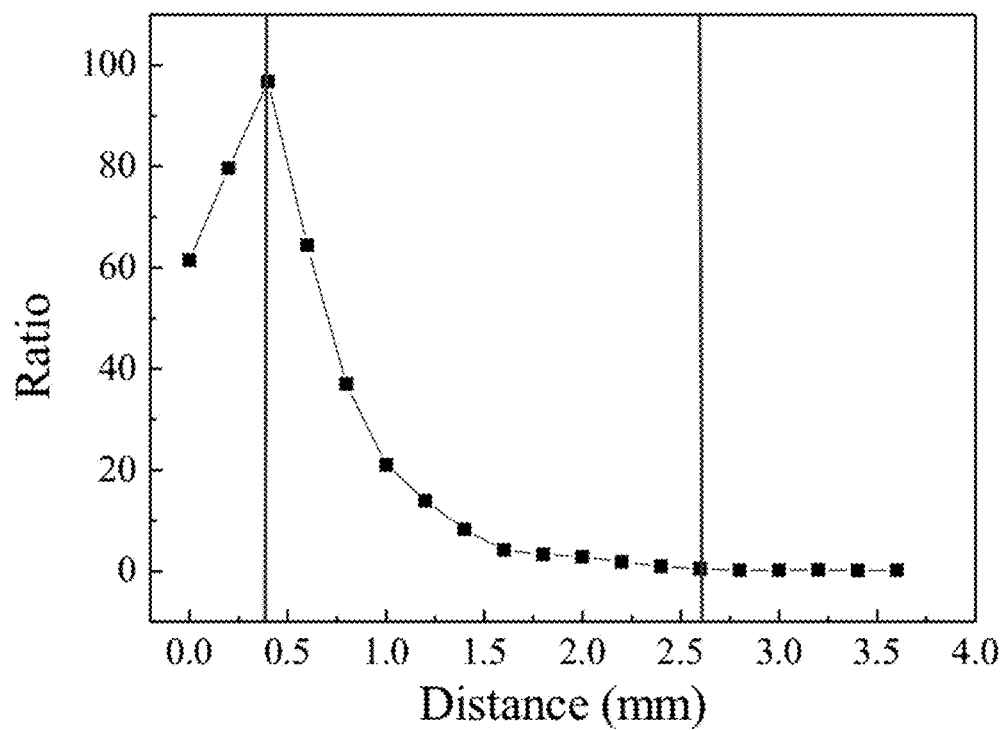
FIG. 11 shows the ratio (the peak intensity of PFO/the peak intensity of F8BT) against distance graph and it showed the effective range: 2.2 mm (from 0.4 mm to 2.6 mm)
Figure 12:
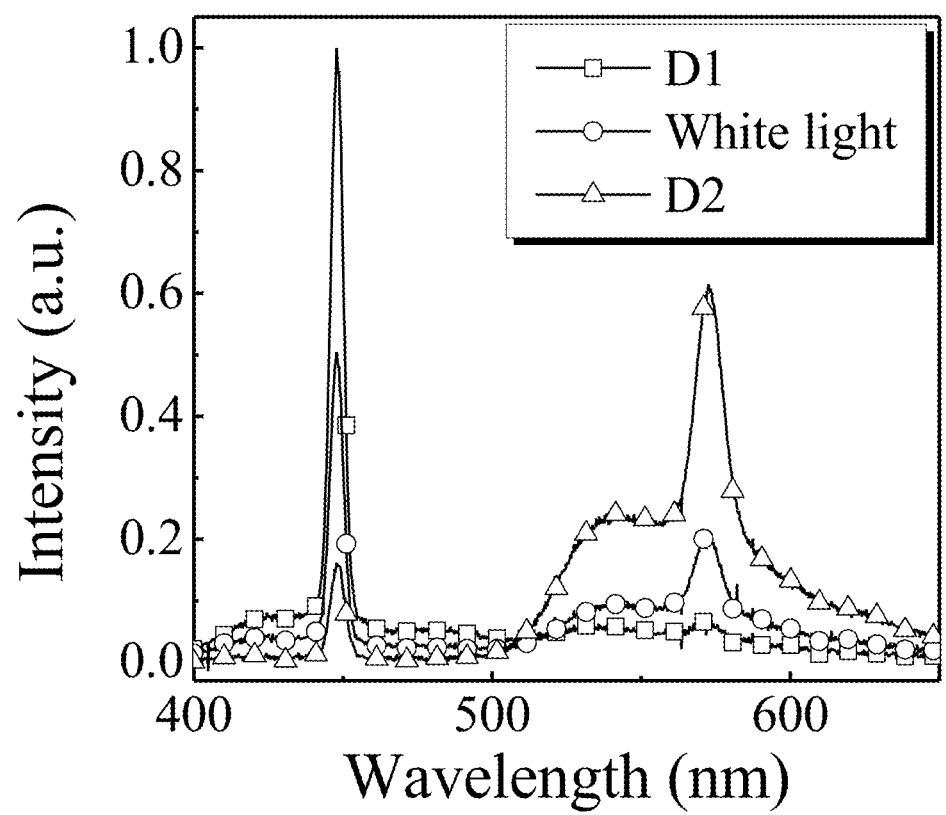
FIG. 12 shows normalized ASE spectra in different positions from edge of the sample with same pumping energy density at 247 μJ/cm$^2$; D1 and D2 are defined in FIG. 1, the white light representing the white light ASE with CIE coordinate (0.32, 0.35)

The purpose of this optical sensor is to monitor and measure relatively small distance vibrations. Assume that there is an object to be detected for vibration using this sensor. The sensor's operating principle is to first receive lasing spectra before and after the vibration, and then to calculate the peak ratios (or both peak intensities) between PFO and F8BT. Finally, using the ratios (or both peak intensities), we can extract the distances to find the vibration of the object. For the optical sensor, we separate the sensor results to two parts: one for the horizontal direction and another one for the vertical direction (x and y directions respectively shown in FIG. 1). In the experiment, we find the statistics to support the sample as an optical sensor, such as the resolution, accuracy and effective range. Firstly, using the same experiment configuration, we tested the sample in the horizontal direction. In FIG. 11, it is a graph plotting the ratio against the distance. The ratio represents the peak intensity of PFO divided by the peak intensity of F8BT, and the aforementioned distance is the distance along the horizontal direction. The figure shows that the effective range is 2.2 mm, i.e. from 0.4 mm to 2.6 mm in distance. The effective range is defined as the ratio that is not identical to each other and is under the same trend. After calculation, the accuracy is ±0.11 mm and the defined resolution is 0.25 mm. Along the horizontal direction, the lasing spectra is the same as the one shown in FIG. 12, both ASE peak being affected by the different positions of fiber.

Figure 13:
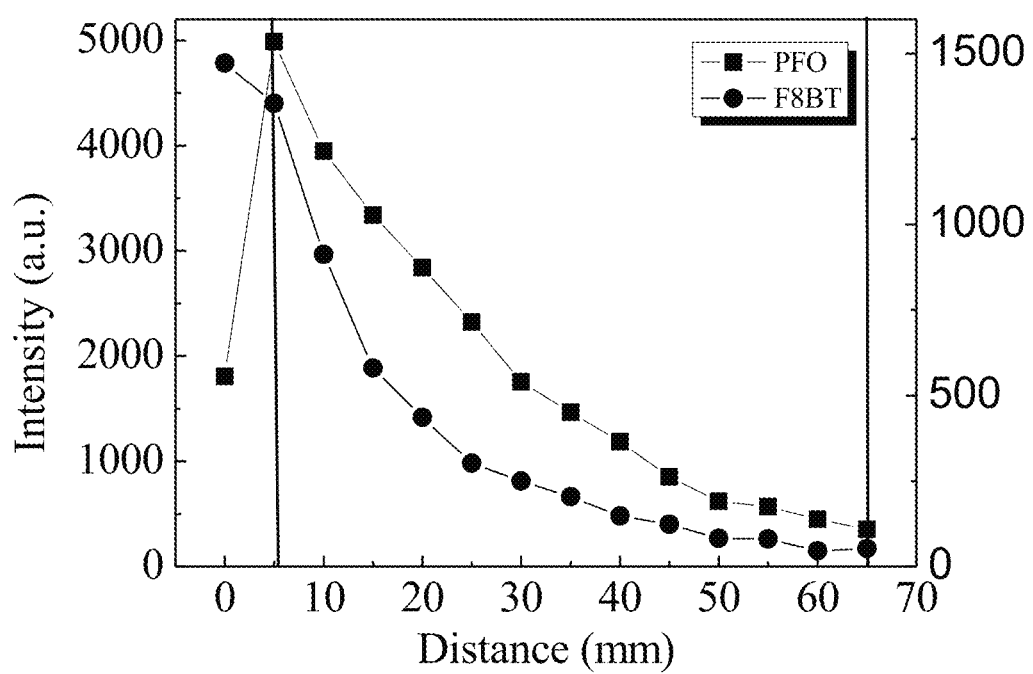
FIG. 13 shows the ratio (the peak intensity of PFO/the peak intensity of F8BT) against distance graph and it showed the effective range: 2.2 mm (from 0.4 mm to 2.6 mm)

For the vertical direction, we use the original ASEPFO and ASEF8BT peak intensities to replace the ratio as a parameter for the sensor. It is because along this direction the peak intensities are both decreased as the distance increased. Thus, the ratio between both peak intensities remains the same, and it is no longer suitable to be a characterizing factor of the sensor. In FIG. 13, it shows PFO and F8BT intensities against the distance along the vertical direction. The figure shows that the effective range is 60 mm, i.e. from 6 mm to 66 mm in distance. The effective range is defined to be the same as before. After calculation, the accuracy is ±3.8 mm and the defined resolution is 8 mm.

Figure 14:
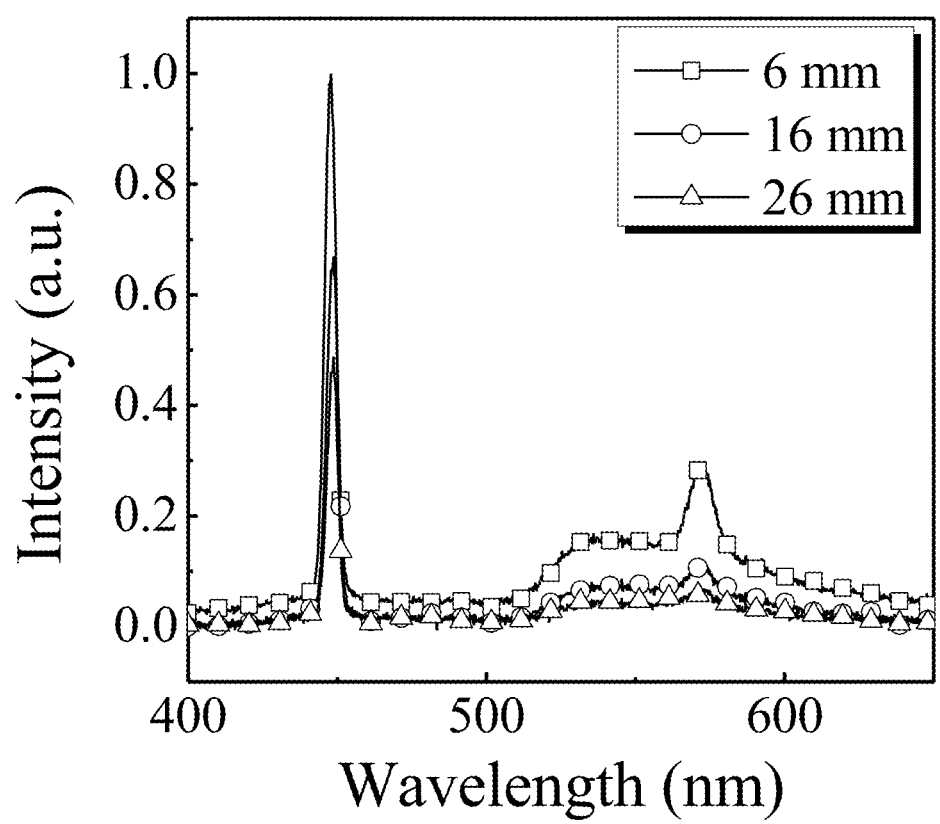
FIG. 14 shows the ASE spectra in different positions from edge of the sample with same pumping energy density at 247 μJ/cm$^2$.

In the vertical direction, the lasing spectra shows that both ASE peak was decreased when the detector was away from the sample (as shown in FIG. 14).

Findings and the Present Invention: Examples and Applications

We have demonstrated a device made of cascaded organic thin films. The ASE from the two materials can be simultaneously obtained after being pumped by an optical laser. The emission spectrum of ASE was achieved in the far field with tunable color. In both the vertical and the horizontal directions, we have shown that the device that can be used as a distance sensor.

Based on the findings, the present invention is detailed as follows.

In example one, the present invention includes a tunable amplified spontaneous emission (ASE) laser source comprising at least two laser sources excited by a single laser pump wherein each of said at least two laser sources comprises an organic laser or a cascaded organic laser.

Example 2 includes the tunable ASE laser source of example 1 wherein said organic laser or said cascaded organic laser is a thin film laser generating device.

Example 3 includes the features of example 1 wherein said organic laser or said cascaded organic laser comprises at least blue and green emission organic semiconductors.

Example 4 includes the tunable ASE laser source of example 1 wherein one of the at least two laser sources comprises a thin film laser generating device comprising Poly (9, 9-di-n-dodecylfluorenyl-2, 7-diyl) and the other of the at least two laser sources comprises a thin film laser generating device comprising Poly [(9, 9-di-n-octylfluorenyl-2, 7-diyl)-alt-(benzo[2,1,3]thiadiazol-4,8-diyl)].

Example 5 includes the tunable ASE laser source of example 1 wherein the single laser pump comprises a third harmonic laser from Nd:YAG.

Example 6 includes the tunable ASE laser source of example 3 wherein the single laser pump comprises a pulsed UV emission laser.

Example 7 includes the tunable ASE laser source of example 1 wherein one of the at least two laser sources comprises a thin film laser generating device of lasing organic material comprising Poly (9, 9-di-n-dodecylfluorenyl-2, 7-diyl) and the other of the at least two laser sources comprises a thin film laser generating device comprising Poly [(9, 9-di-n-octylfluorenyl-2, 7-diyl)-alt-(benzo[2,1,3]thiadiazol-4,8-diyl)] and wherein the single laser pump comprises a pulsed laser which further comprises a third harmonic laser comprising Nd:YAG.

Example 8 includes the tunable ASE laser source of example 1 wherein said organic laser or said cascaded organic laser comprises at least blue and green emission organic semiconductors and wherein the single laser pump is comprises a pulsed UV emission laser.

Example 9 includes the tunable ASE laser source of example 1 wherein at least one of the at least two laser sources is a two-dimensional paired laser element.

Example 10 includes the tunable ASE laser source of example 1 wherein each of the at least two laser sources is a two-dimensional paired laser element.

Example 11 includes a method of operating a tunable ASE laser source comprising emitting an optical pulse from a pulsed laser pump source to a thin film laser device comprising at least first and second cascaded organic thin films; emitting a first laser pulse from the first organic thin film at a first time slot; emitting a second laser pulse from the second organic film at a second time slot; wherein a time delay between the first time slot and the second time slot is a picosecond or less.

Example 12 includes the method of operating a tunable ASE of example 11 wherein the first organic thin film comprises Poly (9, 9-di-n-dodecylfluorenyl-2, 7-diyl) and the second organic thin film comprises Poly [(9, 9-di-n-octylfluorenyl-2, 7-diyl)-alt-(benzo[2,1,3]thiadiazol-4,8-diyl)].

Example 13 includes the method of operating a tunable ASE of example 11 wherein at least one of the at least two laser sources is a two-dimensional paired laser element.

Example 14 includes the method of operating a tunable ASE of example 11 wherein each of the at least two laser sources is a two-dimensional paired laser element.

The present invention provides a system for measuring displacements and movements, wherein said measured displacements include very fine displacements and said measured movements include very minute movements. The system comprises one or more measuring means at least configured to tune multiple color emissions from a laser such that the tuned multiple color emissions of the laser are used to measure said displacements and said movements. Said laser comprises an organic laser and/or a cascaded organic laser. In particular, said system is scalable in order to support the measuring of displacements and movements across one or more physical/geographical spaces including very large physical and/or geographical spaces.

Optionally, the system further comprises a thin film laser generating device for generating said laser. The system may further comprise blue and green emission organic semiconductors for generating said organic laser. It is also optional that the system further comprises laser sensors for sensing said laser wherein said laser sensors comprise organic laser sensors and/or cascaded organic laser sensors. Said laser sensors may or may not require any power for operation, or may be passive devices.

One advantage of the system is that the system is configurable for measuring one or more directions simultaneously.

The system is configurable for position and vibration measurements as well as for measurements of rotational displacements/movements and of angular displacements/movements.

The present invention also provides a method for measuring displacements and movements. Said measured displacements include very fine displacements and said measured movements include very minute movements. One or more directions may be measured simultaneously by the method. The method comprises tuning multiple color emissions from a laser such that the tuned multiple color emissions of the laser are used to measure said displacements and said movements. Said laser comprises an organic laser and/or a cascaded organic laser. In addition, said method is scalable in order to support the measuring of displacements and movements across one or more physical/geographical spaces including very large physical and/or geographical spaces.

Said measured displacements and/or said measured movements may include one or more of: rotational displacements; rotational movements; angular displacements; and angular movements.

Optionally, said laser is generated by a thin film laser generating device. It is also optional that said organic laser is generated at least from blue and green emission organic semiconductors, and that laser sensors are used for sensing said laser where said laser sensors comprise organic laser sensors and/or cascaded organic laser sensors. Said laser sensors may or may not require any power for operation.

INDUSTRIAL APPLICABILITY

This invention relates to a tunable amplified spontaneous emission (ASE) laser source comprising at least two laser sources excited by a single pump laser. More particularly, the present invention relates to a tunable amplified spontaneous emission (ASE) laser source comprising at least two laser sources excited by a single pump laser wherein each of said at least two laser sources comprises an organic laser or a cascaded organic laser. The invention is used for providing a tunable amplified spontaneous emission (ASE) laser source comprising at least two laser sources excited by a single pump laser.

What we claim is:

1. A tunable amplified spontaneous emission (ASE) laser source comprising at least two laser sources excited by a single laser pump wherein each of said at least two laser sources comprises an organic laser or a cascaded organic laser;
wherein one of the at least two laser sources comprises a thin film laser generating device comprising Poly (9, 9-di-n-dodecylfluorenyl-2, 7-diyl) and the other of the at least two laser sources comprises a thin film laser generating device comprising Poly [(9, 9-di-n-octyl-fluorenyl-2, 7-diyl)-alt-(benzo[2,1,3]thiadiazol-4,8-diyl)].

2. The tunable ASE laser source according to claim 1 wherein said organic laser or said cascaded organic laser is a thin film laser generating device.

3. The tunable ASE laser source according to claim 1 wherein said organic laser or said cascaded organic laser comprises at least blue and green emission organic semiconductors.

4. The tunable ASE laser source according to claim 1 wherein the single laser pump comprises a third harmonic laser from Nd:YAG.

5. The tunable ASE laser source according to claim 3 wherein the single laser pump comprises a pulsed UV emission laser.

6. The tunable ASE laser source according to claim 1 wherein said organic laser or said cascaded organic laser comprises at least blue and green emission organic semiconductors and wherein the single laser pump is comprises a pulsed UV emission laser.

7. The tunable ASE laser source according to claim 1 wherein at least one of the at least two laser sources is a two-dimensional paired laser element.

8. The tunable ASE laser source according to claim 7 wherein each of the at least two laser sources is a two-dimensional paired laser element.

9. A method of operating a tunable ASE laser source comprising:
emitting an optical pulse from a pulsed laser pump source to a thin film laser device comprising at least first and second cascaded organic thin films;
emitting a first laser pulse from the first organic thin film at a first time slot;
emitting a second laser pulse from the second organic film at a second time slot;
wherein a time delay between the first time slot and the second time slot is a picosecond or less.

10. The method of operating a tunable ASE laser source according to claim 9 wherein the first organic thin film comprises Poly (9, 9-di-n-dodecylfluorenyl-2, 7-diyl) and the second organic thin film comprises Poly [(9, 9-di-n-octylfluorenyl-2, 7-diyl)-alt-(benzo [2,1,3]thiadiazol-4,8-diyl)].

11. The method of operating a tunable ASE laser source according to claim 9 wherein at least one of the at least two laser sources is a two-dimensional paired laser element.

12. The method of operating a tunable ASE laser source according to claim 9 wherein each of the at least two laser sources is a two-dimensional paired laser element.

* * * * *